United States Patent
Yoo

(10) Patent No.: US 10,923,501 B2
(45) Date of Patent: Feb. 16, 2021

(54) FERROELECTRIC MEMORY DEVICE AND METHOD OF MANUFACTURING THE SAME

(71) Applicant: SK hynix Inc., Icheon (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/694,683

(22) Filed: Nov. 25, 2019

(65) Prior Publication Data

US 2020/0105770 A1   Apr. 2, 2020

Related U.S. Application Data

(63) Continuation-in-part of application No. 15/810,177, filed on Nov. 13, 2017, now Pat. No. 10,522,564.

(30) Foreign Application Priority Data

Feb. 23, 2017   (KR) .......................... 10-2017-0024301

(51) Int. Cl.
  *H01L 27/1159*   (2017.01)
  *H01L 29/51*   (2006.01)
  *H01L 29/66*   (2006.01)
  *G11C 5/06*   (2006.01)
  *G11C 11/22*   (2006.01)

(52) U.S. Cl.
  CPC .......... *H01L 27/1159* (2013.01); *G11C 5/063* (2013.01); *G11C 11/223* (2013.01)

(58) Field of Classification Search
  CPC ............. H01L 29/517; H01L 21/28291; H01L 21/02189; H01L 21/02181; H01L 29/78391; H01L 29/513; H01L 29/6684; H01L 21/02194; H01L 29/42364; H01L 27/1159; H01L 29/40111; H01L 27/11507; H01L 29/516; G11C 5/063; G11C 11/223; G11C 11/221
  See application file for complete search history.

(56) References Cited

U.S. PATENT DOCUMENTS

| | | | |
|---|---|---|---|
| 6,236,076 B1 * | 5/2001 | Arita | ................ H01L 29/40111 257/295 |
| 2002/0130337 A1 | 9/2002 | Michida et al. | |
| 2015/0310905 A1 | 10/2015 | Karda et al. | |
| 2015/0340372 A1 * | 11/2015 | Pandey | ............. H01L 29/78391 257/295 |
| 2016/0064655 A1 | 3/2016 | Tao et al. | |

* cited by examiner

*Primary Examiner* — David Vu

(57) ABSTRACT

In an embodiment, a ferroelectric memory element includes a first electrode layer, a ferroelectric structure disposed on the first electrode layer, and a second electrode layer disposed on the ferroelectric structure. The ferroelectric structure includes a ferroelectric material layer having a concentration gradient of a dopant.

12 Claims, 11 Drawing Sheets

FERROELECTRIC MEMORY DEVICE AND METHOD OF MANUFACTURING THE SAME

CROSS-REFERENCE TO RELATED APPLICATION

The present application is a continuation in part of pending U.S. patent application Ser. No. 15/810,177, filed on Nov. 13, 2017, which claims priority under 35 U.S.C. 119(a) to Korean Patent Application No. 10-2017-0024301, filed on Feb. 23, 2017. These applications are each incorporated herein by reference in its entirety.

BACKGROUND

1. Technical Field

Embodiments of the present disclosure relate to a ferroelectric memory device and a method of manufacturing the same.

2. Related Art

In general, a ferroelectric material is a material having spontaneous electrical polarization in the absence of an applied external electric field. More specifically, a ferroelectric material can maintain one of two stable remanent polarization states. Thus, a ferroelectric material may be utilized to store digital information in a nonvolatile manner. For example, binary information "0" or "1" may be stored in remanent polarization states.

Remanent polarization in a ferroelectric material can be reversibly switched by an external electric field. The application of ferroelectric materials in nonvolatile memory devices has been actively studied. As an example, perovskite materials, which can manifest ferroelectric properties or characteristics, such as lead zirconate titanate (PZT) or strontium bismuth tantalite (SBT) have been studied for applications in nonvolatile memory devices.

SUMMARY

A ferroelectric memory element according to an aspect of the present disclosure is disclosed. The ferroelectric memory element may include a first electrode layer, a ferroelectric structure disposed on the first electrode layer, and a second electrode layer disposed on the ferroelectric structure. The ferroelectric structure may include a ferroelectric material layer having a concentration gradient of a dopant.

A ferroelectric memory device according to an aspect of the present disclosure is disclosed. The ferroelectric memory device may include a substrate, and a switching transistor and a ferroelectric element disposed on the substrate. The ferroelectric memory element may include a first electrode layer, a ferroelectric structure disposed on the first electrode layer, and a second electrode layer disposed on the ferroelectric structure. The ferroelectric structure may include a ferroelectric material layer having a concentration gradient of a dopant, and a drain electrode of the switching transistor may be electrically connected to the first electrode of the ferroelectric memory element.

A ferroelectric memory device according to an aspect of the present disclosure is disclosed. The ferroelectric memory device may include a substrate having a source region and a drain region, a ferroelectric structure disposed on the substrate, and a gate electrode layer disposed on the ferroelectric structure. The ferroelectric structure includes a ferroelectric material layer having a concentration gradient of a dopant, A method of manufacturing a ferroelectric memory device according to another aspect of the present disclosure is disclosed. In the method, a substrate may be provided. A ferroelectric structure including a ferroelectric material layer having a concentration gradient of a dopant may be formed on the substrate. A gate electrode layer may be formed on the ferroelectric structure.

DETAILED DESCRIPTION

Figure 1:
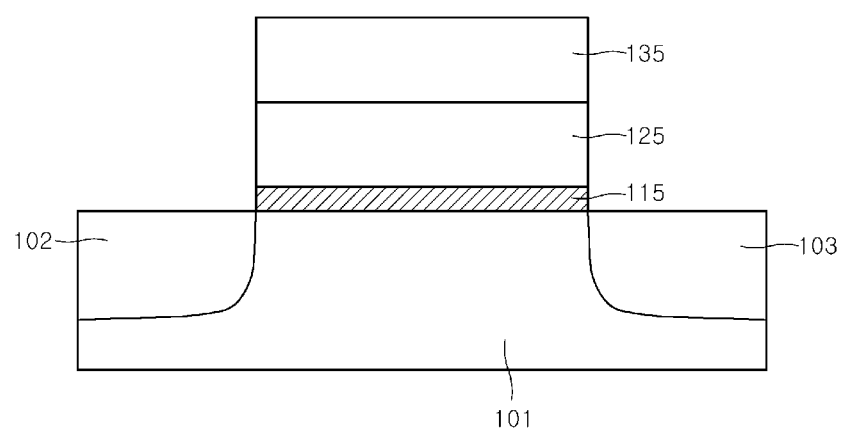
FIG. 1 is a schematic view illustrating a ferroelectric memory device having a ferroelectric structure according to an embodiment of the present disclosure.
Figure 1:
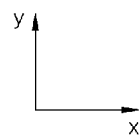

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to as located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have" or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

Techniques for developing or inducing ferroelectric properties in a thin film have been reported in recent research. As an example, it has been reported that, in a thin film fabricating process, when a stress is applied to a thin non-ferroelectric film, a lattice structure of the thin film is transformed, and the thin film develops ferroelectric properties. A hafnium oxide layer is an example of a thin film that, upon application of anisotropic stress, has a lattice structure that transforms from a tetragonal crystal system to an orthorhombic crystal system having ferroelectric properties. J. Müller, et al. (*Nano Lett.*, 2012, 12 (8), pp 4318-4323) have reported that in a solid solution of $Hf_xZr_yO_2$ (0<x, y<1) including hafnium oxide ($HfO_2$) and zirconium oxide ($ZrO_2$), when the content ratio of hafnium (Hf) and zirconium (Zr) constituting the hafnium oxide ($HfO_2$) and the zirconium oxide ($ZrO_2$) is controlled, the $Hf_xZr_yO_2$ solid solution can have a structure of four-crystal system that has ferroelectric properties. In addition, J. Müller, et al. (*Nano Lett.*, 2012, 12 (8), pp 4318-4323), also disclose that when an external electric field is applied to a pure zirconium oxide ($ZrO_2$)thin film, the thin film is transformed to have ferroelectric properties.

Other research in ferroelectric materials and antiferroelectric materials, including research into hafnium oxide thin films or zirconium oxide thin films, has reported that characteristics of ferroelectric properties or antiferroelectric properties vary depending on the concentration of an implanted dopant, the growth of the thin film, or the heat treatment of the thin film. As an example, U. Schroeder, et al. (*Japanese Journal of Applied Physics*, 2014, 53(8S1)) reported that the polarization hysteresis curve of a hafnium oxide layer varies depending on the concentration of a silicon oxide material dopant in the hafnium oxide layer. In another example, D. Zhou, et al. (*Applied Physics Letters*, 2013, 103(19), 2904) reported that the shape of the polarization hysteresis curve of a silicon-doped hafnium oxide thin film changes according to the number of cycles of an applied pulse voltage.

An embodiment of the present disclosure includes a ferroelectric structure including a ferroelectric material layer disposed on a substrate. The ferroelectric material layer includes a concentration gradient of a dopant. The dopant may generate a lattice strain in the ferroelectric material layer. Also, the dopant is distributed in a concentration gradient in the ferroelectric material layer, resulting in a gradient of lattice strain in the ferroelectric material layer. The gradient of lattice strain generates a flexoelectric effect, forming an internal electric field in the ferroelectric material layer. The flexoelectric effect may be a phenomenon in which an electric field is formed by a lattice strain gradient. A lattice strain gradient may be generated by lattice mismatch within a material layer, or by lattice mismatch at an interface between material layers that may be heterogeneous.

In an embodiment of the present disclosure, an internal electric field formed in a ferroelectric material layer can improve polarization alignment inside the ferroelectric material layer. In an embodiment of the present disclosure, the thickness of a ferroelectric material layer may be reduced or controlled to increase the gradient of the lattice strain causing a flexoelectric effect. For example, the ferroelectric material layer may have a thickness of about five nanometers (5 nm) to ten nanometers (10 nm).

An internal electric field resulting from flexoelectric effects may improve polarization orientation in one direction such that the ferroelectric properties of a ferroelectric structure may be stabilized. As an example, an internal electric field may suppress or prevent the ferroelectric state of the ferroelectric structure from being transformed into a paraelectric state or an antiferroelectric state. As another example, an internal electric field may align, in one direction, defective, randomly ordered dipoles in the ferroelectric material layer. The defective dipoles may be generated by defects existing in the ferroelectric material layer.

FIG. 1 is a schematic view illustrating a ferroelectric memory device 10 having a ferroelectric structure according to an embodiment of the present disclosure. Referring to FIG. 1, ferroelectric memory device 10 may include a substrate 101 having a source region 102 and a drain region 103. In addition, ferroelectric memory device 10 may include a ferroelectric structure 125 and a gate electrode layer 135, which are disposed over substrate 101. In a writing operation, the polarization state of ferroelectric structure 125 may be determined depending on the polarity or magnitude of a voltage applied to gate electrode layer 135. In addition, the polarization state can be stored in ferroelectric structure 125 in a nonvolatile manner. In a reading operation, the electrical resistance of the channel region in substrate 101 can be determined according to the polarization state of ferroelectric structure 125. Therefore, electrical information stored in ferroelectric structure 125 can be read.

Referring to FIG. 1, substrate 101 may include a semiconductor material. Substrate 101 may, for example, be a silicon (Si) substrate, a gallium arsenide (GaAs) substrate, an indium phosphide (InP) substrate, a germanium (Ge) substrate, or a silicon germanium (SiGe) substrate, as non-limiting examples. Substrate 101 may be doped with an n-type or p-type dopant to have a determined conductivity.

Source region 102 and drain region 103 may be doped with n-type or p-type dopants. In an embodiment, when substrate 101 is n-type doped, source region 102 and drain region 103 may be p-type doped. In another embodiment, when substrate 101 is p-type doped, source region 102 and drain region 103 may be n-type doped.

An interfacial insulation layer 115 may be disposed between substrate 101 and ferroelectric structure 125. Interfacial insulation layer 115 may form stable interfaces with each of the substrate 101 and ferroelectric structure 125 such that Interfacial insulation layer 115 suppresses interfacial defects generated at an interface when substrate 101 directly contacts with ferroelectric structure 125. The interfacial defects may deteriorate an insulation property between the substrate 101 and ferroelectric structure 125. In addition, interfacial insulation layer 115 can suppress or prevent material diffusion between substrate 101 and ferroelectric structure 125. Interfacial insulation layer 115 may comprise silicon oxide, silicon nitride, or silicon oxynitride as non-limiting examples. Interfacial insulation layer 115 may have an amorphous state.

In an embodiment, ferroelectric structure 125 may have a ferroelectric material layer having a concentration gradient of dopant. Ferroelectric structure 125 may comprise a single layer structure or ferroelectric structure 125 may comprise a plurality of layers resulting in a multilayered structure. Each of the plurality of layers may be substantially the same in composition, or the plurality of layers may differ in composition. In another embodiment, ferroelectric structure 125 may comprise a hafnium oxide layer or a zirconium oxide layer, or both a hafnium oxide layer and a zirconium oxide layer. In some embodiments, ferroelectric structure 125 comprises a single ferroelectric material layer that may have a concentration gradient of dopant resulting in a lattice strain gradient through the layer and ferroelectric structure 125. In other embodiments, a plurality of ferroelectric material layers are doped to produce a lattice strain gradient through ferroelectric structure 125. In yet other embodiments, each of a plurality of ferroelectric material layers are doped to produce a lattice strain gradient through each respective layer, and therefore the lattice strain gradient may vary from layer to layer.

In an embodiment, ferroelectric structure 125 may have a thickness of about 5 nm to 10 nm. In an embodiment, the dopant in a ferroelectric material layer may be carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, by way of non-limiting examples.

In an embodiment, the concentration gradient of a dopant may be formed in one direction, along a thickness direction of the ferroelectric material layer. For example, the thickness direction may be a direction that is substantially perpendicular to a surface of substrate 101 or substantially perpendicular to a surface of interfacial insulation layer 115. Referring to FIG. 1, the thickness direction may be a direction that is parallel to the y-direction consistent with the X-Y axis illustrated in therein. In some embodiments, the concentration of the dopant may be distributed so as to continuously increase or continuously decrease along the thickness direction of ferroelectric structure 125.

Referring to FIG. 1, a gate electrode layer 135 may be disposed on ferroelectric material layer 125. Gate electrode layer 135 may, for example, include metal, conductive metal nitride, conductive metal oxide, or conductive metal carbide. Gate electrode layer 135 may include tungsten (W), titanium (Ti), copper (Cu), aluminum (Al), ruthenium (Ru), tungsten nitride, titanium nitride, tantalum nitride, tungsten carbide, titanium carbide, tungsten silicide, titanium silicide, tantalum silicide, ruthenium oxide, or a combination of two or more thereof, as non-limiting examples.

As described above, ferroelectric memory device 10 may include ferroelectric structure 125 as a gate dielectric layer. Ferroelectric structure 125 may include a ferroelectric material layer having a concentration gradient of the dopant. The ferroelectric material layer may have a lattice strain gradient generated by the concentration gradient of the dopant. The lattice strain gradient may generate a flexoelectric effect, resulting in an internal electric field within the ferroelectric material layer. The internal electric field formed in the ferroelectric material layer can improve polarization alignment inside the ferroelectric material layer, thereby stabilizing the ferroelectric properties of the ferroelectric structure.

Figure 2:
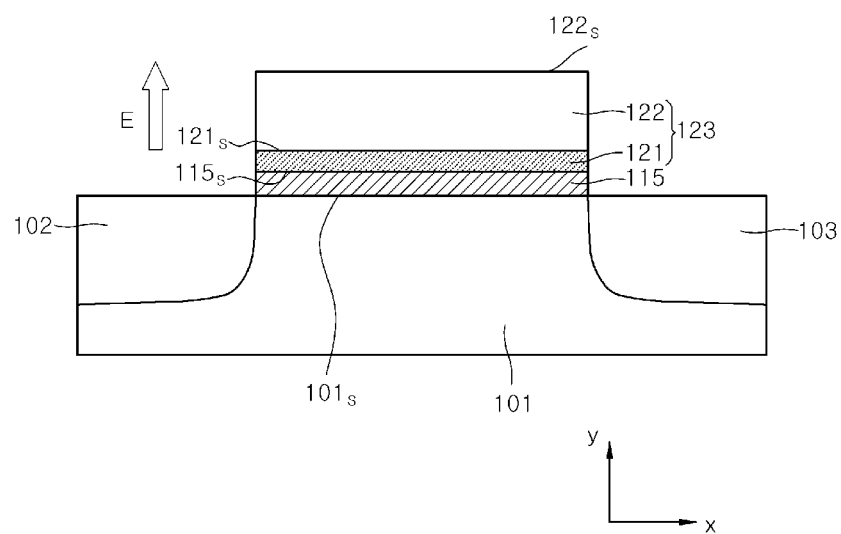
FIG. 2 is a schematic view illustrating another ferroelectric structure of a ferroelectric memory device according to an embodiment of the present disclosure.

FIG. 2 is a schematic view illustrating another ferroelectric structure 123 of the ferroelectric memory device 10 according to an embodiment of the present disclosure. Referring to FIG. 2, ferroelectric structure 123 may be disposed on an upper surface 115s of interfacial insulation layer 115. Although it is not shown in FIG. 2, gate electrode layer 135 of FIG. 1 may be disposed on the ferroelectric structure 123. Interfacial insulation layer 115 may be disposed on an upper surface 101s of substrate 101. In some embodiments, interfacial insulation layer 115 may be omitted, and ferroelectric structure 123 may be directly disposed on upper surface 101s of substrate 101.

In an embodiment, ferroelectric structure 123 may include a first layer 121 and a second layer 122. As an example, first layer 121 may be an undoped ferroelectric material layer and second layer 122 may be a ferroelectric material layer having a concentration gradient of a dopant. The concentration gradient of the dopant may be formed in one direction along a thickness direction of second layer 122. For instance, the thickness direction may be a direction that is substantially perpendicular to upper surface 101s of substrate 101 or substantially perpendicular to upper surface 115s of interfacial insulation layer 115. Also, the thickness direction may be a direction that is parallel to the y-direction consistent with the X-Y axis illustrated in FIG. 2. In an embodiment, the concentration of the dopant may be distributed to continuously increase or decrease along the thickness direction of second layer 122. The dopant may be carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, by way of non-limiting examples.

In another embodiment (not illustrated in FIG. 2), in ferroelectric structure 123, second layer 122 having a concentration gradient of dopant may be disposed on interfacial insulation layer 115, and an undoped first layer 121 may be disposed on second layer 122.

Examples of embodiments include, in ferroelectric structure 123, first layer 121 including an undoped ferroelectric hafnium oxide layer, and second layer 122 including a ferroelectric hafnium oxide layer doped with a dopant. In another example, first layer 121 may include an undoped ferroelectric zirconium oxide layer, and second layer 122 may include a ferroelectric zirconium oxide layer doped with a dopant. In yet another example, first layer 121 may include an undoped ferroelectric hafnium oxide layer and second layer 122 may include a ferroelectric zirconium oxide layer doped with a dopant. In a further example, first layer 121 may include an undoped ferroelectric zirconium oxide layer and second layer 122 may include a ferroelectric hafnium oxide layer doped with a dopant.

In an embodiment, a lattice strain due to lattice mismatch may occur at an interface between an undoped first layer 121 and a doped second layer 122. The dopant concentration gradient in second layer 122 may generate a lattice strain gradient in second layer 122. The flexoelectric effect generated by the lattice strain at interface 121s of first layer 121 and second layer 122, and by the lattice strain gradient in second layer 122, may form an internal electric field E in second layer 122. Although FIG. 2 illustrates an internal electric field E formed in a direction from interface 121s between first layer 121 and second layer 122 to a surface 122s of second layer, the direction of the internal electric field E may be reversed, depending on the concentration gradient direction of the dopant.

Internal electric field E may improve the polarization orientation inside second layer 122. As the polarization orientation is improved by internal electric field E, the ferroelectric properties of second layer 122 can be stabilized. For example, internal electric field E can suppress or prevent the ferroelectric properties of second layer 122 from being transformed into paraelectric properties or antiferroelectric properties. As another example, internal electric field E can align defective, randomly distributed dipoles in second layer 122 in a single direction. Accordingly, internal electric field E can improve the ferroelectric properties of second layer 122.

Referring to FIG. 2, in another embodiment, first layer 121 of ferroelectric structure 123 may be a first ferroelectric material layer doped with a first dopant, and second layer 122 may be a second ferroelectric material layer doped with a second dopant. The first and second dopants may, for example, include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof as non-limiting examples. At least one of the first and second ferroelectric material layers may have a concentration gradient of dopant.

In an embodiment, the first dopant and the second dopant may be different from each other. For example, first layer 121 may include a ferroelectric hafnium oxide layer doped with a first dopant, and second layer 122 may include a ferroelectric hafnium oxide layer doped with a second, different dopant. In another example, first layer 121 may include a ferroelectric zirconium oxide layer doped with a first dopant, and second layer 122 may include a ferroelectric zirconium oxide layer doped with a second, different dopant. In yet another example, first layer 121 may include a ferroelectric zirconium oxide layer doped with a first dopant, and second layer 122 may include a ferroelectric hafnium oxide layer doped with a second dopant.

In another embodiment, the first dopant and the second dopant may be the same. As an example, first layer 121 may include a zirconium oxide layer doped with a dopant, and second layer 122 may include a hafnium oxide layer doped with the same dopant.

In another embodiment, first layer 121 may be a ferroelectric $Hf_{0.5}Zr_{0.5}O_2$ layer and second layer 122 may be a ferroelectric material layer doped with a dopant. Second layer 122 may have a concentration gradient of the dopant. Second layer 122 may include a hafnium oxide ($HfO_2$) layer or a zirconium oxide ($ZrO_2$) layer. In some other embodiments (not illustrated in FIG. 2), second layer 122 having a dopant concentration gradient may be disposed on interfacial insulation layer 115 and a ferroelectric $Hf_{0.5}Zr_{0.5}O_2$ first layer 121 may be disposed on the second layer 122.

In an embodiment, the thickness of first layer 121 or second layer 122 can be reduced to a thickness level at which the lattice strain gradient of the layer can sufficiently generate a flexoelectric effect. For example, the thickness of a ferroelectric material layer may be substantially the same as the grain size of a ferroelectric material layer. Accordingly, a single grain of a ferroelectric material layer can form interfaces with other layers at both upper and lower surfaces of the ferroelectric material layer. In an embodiment, first layer 121 or second layer 122 may each have a thickness of about 5 nm to 10 nm. In another embodiment, ferroelectric structure 123 may have a total thickness of about 5 nm to 10 nm.

As described above, a lattice strain due to lattice mismatch may occur in the interface between first layer 121 and second layer 122. Inside the ferroelectric material layer having a concentration gradient of dopant, an internal electric field can be generated by the lattice strain gradient. The internal electric field can improve the polarization orientation in the ferroelectric material layer, thereby stabilizing the ferroelectric properties of the ferroelectric structure.

Figure 3:
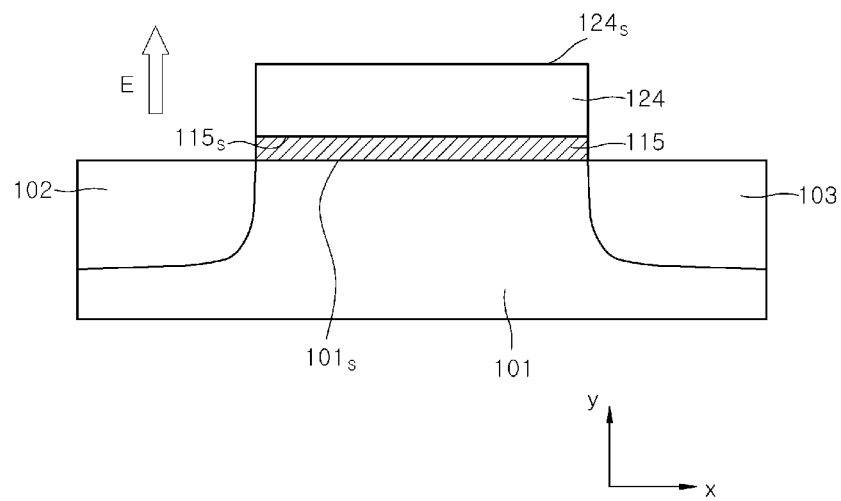
FIG. 3 is a schematic view illustrating another ferroelectric structure of a ferroelectric memory device according to an embodiment of the present disclosure.

FIG. 3 is a schematic view illustrating another ferroelectric structure 124 of ferroelectric memory device 10 according to an embodiment of the present disclosure. Referring to FIG. 3, ferroelectric structure 124 may be disposed on an upper surface 115s of interfacial insulation layer 115. Interfacial insulation layer 115 may be disposed on an upper surface 101s of substrate 101. Although it is not shown in FIG. 3, gate electrode layer 135 of FIG. 1 may be disposed on the ferroelectric structure 124. In some other embodiments, interfacial insulation layer 115 may be omitted, and ferroelectric structure 124 may be directly disposed on the upper surface 101s of substrate 101.

In an embodiment, ferroelectric structure 124 may include a single layer of ferroelectric material having a concentration gradient of dopant. The configuration of ferroelectric structure 124 is substantially the same as the configuration of second layer 122 described in embodiments above and with reference to FIG. 2. Therefore, a detailed description is omitted in order to limit duplication.

The dopant concentration gradient in ferroelectric structure 124 may cause a lattice strain gradient in ferroelectric structure 124. The flexoelectric effect generated by the lattice strain gradient may improve the polarization orientation in ferroelectric structure 124 by forming an internal electric field E in ferroelectric structure 124. By improving the polarization orientation along the internal electric field E, the ferroelectric properties of ferroelectric structure 124 may be stabilized.

Figure 4:
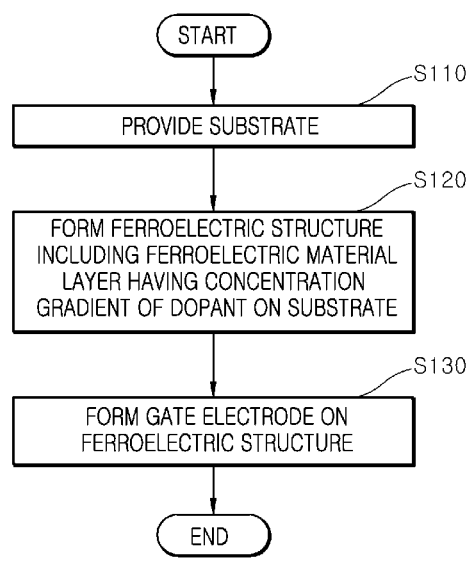
FIG. 4 is a flow chart schematically illustrating a method of manufacturing a ferroelectric memory device according to an embodiment of the present disclosure.

FIG. 4 is a flow chart schematically illustrating a method of manufacturing a ferroelectric memory device according to embodiments of the present disclosure. FIGS. 5 to 8 are schematic views illustrating a method of manufacturing a ferroelectric memory device according to an embodiment of the present disclosure.

Figure 5:
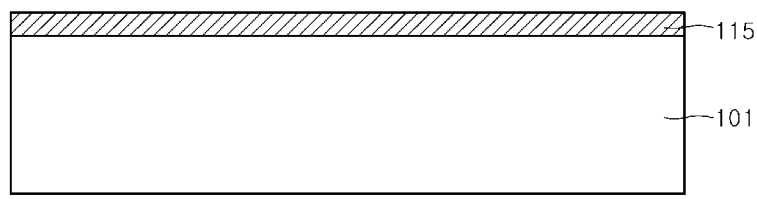
FIGS. 5 to 8 are schematic views illustrating a method of manufacturing a ferroelectric memory device according to an embodiment of the present disclosure.

Referring to operation S110 in FIG. 4 and FIG. 5, substrate 101 may be comprise a silicon (Si) substrate, a gallium arsenide (GaAs) substrate, an indium phosphide (InP) substrate, a germanium (Ge) substrate, or a silicon germanium (SiGe) substrate, by way of non-limiting examples. Substrate 101 may be doped with n-type or p-type dopant to have a determined conductivity.

Referring to FIG. 5, in an embodiment, interfacial insulation layer 110 may be formed on an upper portion of substrate 101. Interfacial insulation layer 110 may compensate for a difference in lattice constant between a ferroelectric structure 120 that will be formed on interfacial insulation layer 110 and substrate 101 to eliminate, reduce or control interfacial stress. For example, interfacial insulation layer 110 may have a lattice constant that is between the lattice constant of substrate 101 and the lattice constant of ferroelectric structure 120. In addition, interfacial insulation layer 110 can serve as a barrier to material diffusion between substrate 101 and ferroelectric structure 120.

Interfacial insulation layer 110 may include, as non-limiting examples, silicon oxide, silicon nitride, or silicon oxynitride. Interfacial insulation layer 110 may be formed by, for example, a chemical vapor deposition method, an atomic layer deposition method, a coating method or other methods known in the art.

Figure 6:
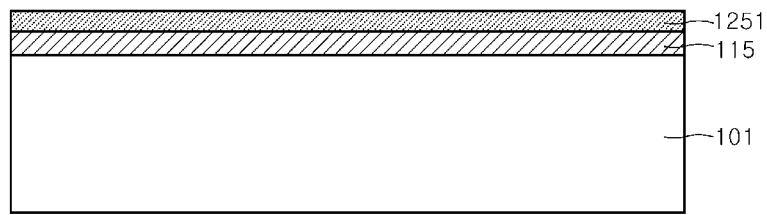
Figure 7:
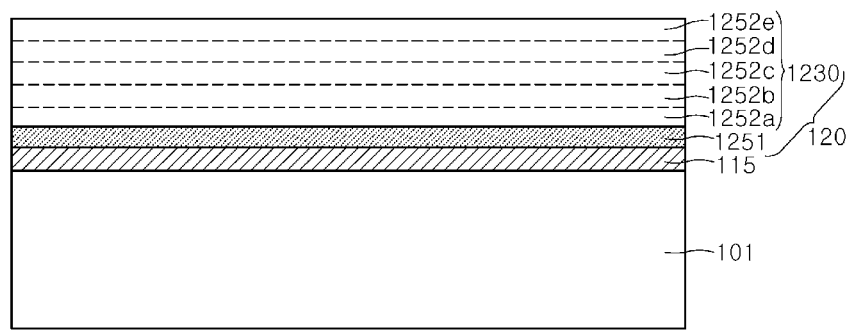

Referring to operation S120 in FIG. 4 and FIGS. 6 and 7, ferroelectric structure 120 including a ferroelectric material layer 1230 having a concentration gradient of a dopant may be formed on interfacial insulation layer 110. The dopant may include, as non-limiting examples, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La) or a combination of two or more thereof.

As illustrated in FIGS. 6 and 7, in an embodiment, ferroelectric structure 120 may include a first layer 1251 formed on interfacial insulation layer 110. First layer 1251 may be an undoped ferroelectric material layer. A second ferroelectric material layer 1230 may be formed on first layer 1251. Second ferroelectric material layer 1230 may include a plurality of unit layers 1252a, 1252b, 1252c, 1252d, and 1252e each having different concentrations with respect to a dopant. In an example, unit layers 1252a, 1252b, 1252c, 1252d, and 1252e may each comprise the same ferroelectric material layer composition and dopant, but each of the unit layers 1252a, 1252b, 1252c, 1252d, and 1252e may have different dopant concentrations within each respective unit layer. In another example, second ferroelectric material layer 1230 may be formed with a continuously increasing or a continuously decreasing concentration gradient with respect to a dopant by controlling the dopant concentrations in its unit layers. In another example, first layer 1251 and second ferroelectric material layer 1230 may comprise the same ferroelectric material layer composition.

As illustrated in FIG. 7, in an embodiment, five unit layers 1252a, 1252b, 1252c, 1252d, and 1252e are shown formed sequentially on first layer 1251, as an example. In other examples, the unit layers need not be formed in a sequence limited to that illustrated in FIG. 7. In yet other examples, ferroelectric material layer 1230 may comprise a single unit layer, or a plurality of unit layers.

In an example of an embodiment, first layer 1251 may be an undoped ferroelectric hafnium oxide layer and second ferroelectric material layer 1230 may comprise a ferroelectric hafnium oxide layer doped with a dopant. In another example, first layer 1251 may be an undoped ferroelectric zirconium oxide layer and second ferroelectric material layer 1230 may comprise a ferroelectric zirconium oxide layer doped with a dopant. In yet another example, first layer 1251 may be an undoped ferroelectric hafnium oxide layer and second ferroelectric material layer 1230 may comprise a ferroelectric zirconium oxide layer doped with a dopant. In a further example, first layer 1251 may be an undoped ferroelectric zirconium oxide layer and second ferroelectric material layer 1230 may comprise a ferroelectric hafnium oxide layer doped with a dopant.

First layer 1251 and second ferroelectric material layer 1230 may be formed, for example, by an atomic layer deposition method, a chemical vapor deposition method, a molecular beam deposition method, or an evaporation method. When forming a concentration gradient of a dopant in second ferroelectric material layer 1230, the amount of the dopant to be implanted in each unit layer can be controlled in the process of forming second ferroelectric material layer 1230. In an embodiment, second ferroelectric material layer 1230 may be formed such that the concentration of the dopant continuously increases or continuously decreases from unit layer 1252a, located at the lowermost portion of second ferroelectric material layer 1230 and formed on first layer 1251, through unit layer 1252e, located at the uppermost portion of second ferroelectric material layer 1230, on which a gate electrode layer may be formed.

In an embodiment, second ferroelectric material layer 1230 may, for example, have a thickness of about 5 nm to 10 nm. In some other embodiments, the thickness of ferroelectric structure 1230, including first layer 1251 and second ferroelectric material layer 1230, may be about 5 nm to 10 nm. In an embodiment, each of the plurality of unit layers 1252a, 1252b, 1252c, 1252d, and 1252e of second ferroelectric material layer 1230 may have substantially the same thickness. In a different embodiment, at least one of the plurality of the unit layers 1252a, 1252b, 1252c, 1252d, and 1252e may have a different thickness from that of the other unit layers.

In one embodiment, a hafnium oxide layer or a zirconium oxide layer may be deposited at a substrate temperature of about 150 degrees Celsius (° C.) to 350(° C.). The doping process for a hafnium oxide layer or a zirconium oxide layer may be performed by controlling the amount of a source gas including the dopant during the deposition of the hafnium oxide layer or the zirconium oxide layer. A hafnium oxide layer or a zirconium oxide layer may be formed in an amorphous state, a partially crystalline state, or a completely crystalline state.

In some embodiments, as illustrated in FIGS. 6 and 7, a first layer 1251 may formed on interfacial insulation layer 110 as a first ferroelectric material layer doped with a first dopant. A second layer 1230 may be formed on first layer 1251. Second layer 1230 may include a plurality of unit layers 1252a, 1252b, 1252c, 1252d, and 1252e each having different concentrations with respect a second dopant.

In one example, the first dopant and the second dopant may be substantially the same. As an example, first layer 1251 and second layer 1230 may be a zirconium oxide layer and a hafnium oxide layer, respectively, and each layer may be doped with substantially the same dopant.

In another example, the first dopant and the second dopant may be different from each other. For instance, first layer 1251 may be a ferroelectric hafnium oxide layer doped with a first dopant, and second layer 1230 may be a ferroelectric hafnium oxide layer doped with a second dopant. As another example, first layer 1251 may be a ferroelectric zirconium oxide layer doped with a first dopant and second layer 1230 may be a ferroelectric oxide layer doped with a second dopant. In yet another example, first layer 1251 may be a ferroelectric zirconium oxide layer doped with a first dopant and second layer 1230 may be a ferroelectric hafnium oxide layer doped with a second dopant.

In a further embodiment, at least one of a first ferroelectric material layer 1251 and a second ferroelectric material layer 1230 has a concentration gradient of dopant. When forming the concentration of the dopant in first layer 1251 and second layer 1230, the amount of the dopant to be implanted into each layer, and into each unit layer, can be controlled in the process of forming the layer or unit layer. For example, the doping process for each layer or unit layer may be performed by controlling the amount of a source gas including the dopant during deposition. The thickness of first layer 1251 or second layer 1230 having a concentration gradient of the dopant may be about 5 nm to 10 nm. In some other embodiments, the thickness of ferroelectric structure 120, including first layer 1251 and second layer 1230, may be about 5 nm to 10 nm.

In some embodiments, as illustrated in FIGS. 6 and 7, first layer 1251 may be a ferroelectric $Hf_{0.5}Zr_{0.5}O_2$ layer and second layer 1230 may be a ferroelectric material layer doped with a dopant. Second ferroelectric material layer 1230 may have a concentration gradient of the dopant.

Second ferroelectric material layer 1230 may include a hafnium oxide layer or a zirconium oxide layer.

In other embodiments not illustrated herein, second layer 1230 having a concentration gradient of a dopant may be disposed on interfacial insulation layer 110 and a ferroelectric $Hf_{0.5}Zr_{0.5}O_2$ layer may be disposed on second layer 1230.

Figure 8:
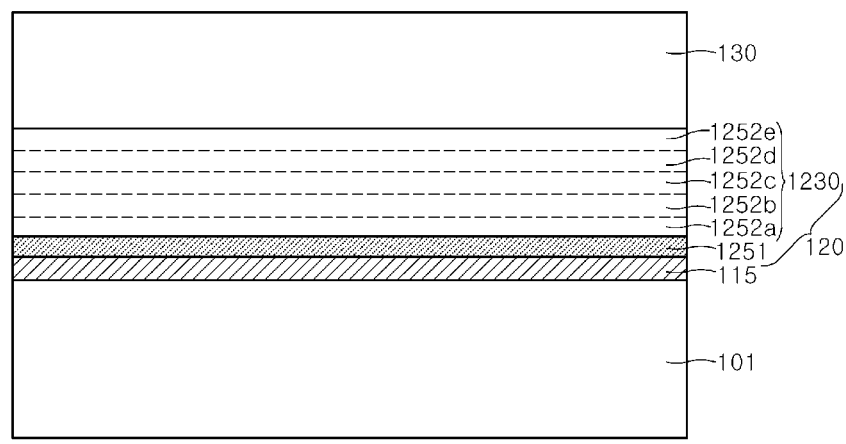

Referring to operation S130 in FIG. 4 and FIG. 8, in an embodiment, a gate electrode layer 130 may be formed on ferroelectric structure 120. Gate electrode layer 130 may include tungsten (W), titanium (Ti), copper (Cu), aluminum (Al), ruthenium (Ru), tungsten nitride, titanium nitride, tantalum nitride, tungsten carbide, titanium carbide, tungsten silicide, titanium silicide, tantalum silicide, or a combination of two or more thereof, by way of non-limiting examples. Gate electrode layer 130 may, for example, be formed using a sputtering method, a chemical vapor deposition method, an evaporation method, or an atomic layer deposition method.

Although not illustrated herein, in an embodiment, when first layer 1251 or second layer 1230 is formed in an amorphous state, a crystallization heat treatment may be additionally performed with respect to first layer 1251 or second layer 1230. The crystallization heat treatment may be performed at a process temperature of about 400° C. to 600° C.

In one example, the crystallization heat treatment may be performed after gate electrode layer 130 is formed. In another embodiment, the crystallization heat treatment may be performed during the process of forming gate electrode layer 130. That is, when the process of forming gate electrode layer 130 is performed at a process temperature of about 400° C. to 600° C., first layer 1251 or second layer 1230 can be crystallized in the process of forming the gate electrode layer 130. In such a case, a separate crystallization heat treatment may be omitted.

Although not illustrated, gate electrode layer 130, second layer 1230, first layer 1251 and interfacial insulation layer 110 may be patterned on substrate 101 to form a gate structure. Although it is not illustrated, a source region and a drain region may be formed in substrate 101 at both ends of the gate structure. The source region and the drain region may be formed by selectively implanting a dopant of a doping type opposite to the doping type of substrate 101 into substrate 101. The source region and the drain region may be formed in an upper region of substrate 101 in the form of a well through known ion implantation method, for example.

As a result, a ferroelectric memory device having a gate structure, a channel region formed in the substrate under the gate structure, and source and drain regions formed in the substrate at both ends of the gate structure can be manufactured.

Figure 9:
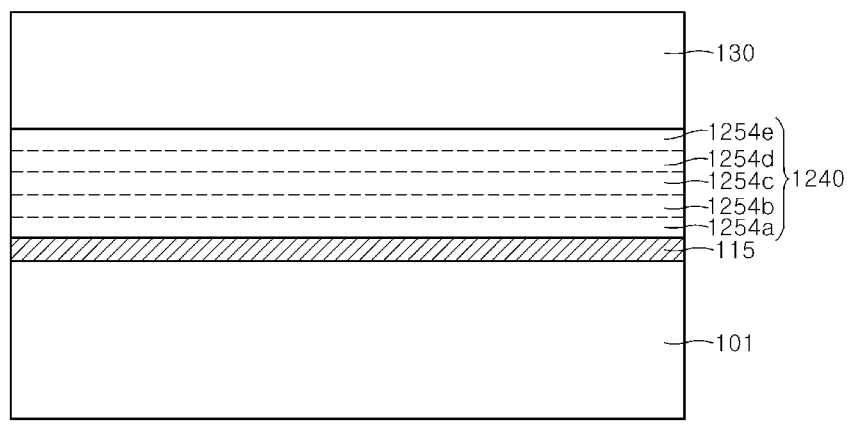
FIG. 9 is a schematic view illustrating a method of manufacturing a ferroelectric memory device according to another embodiment of the present disclosure.

FIG. 9 is a schematic view illustrating a method of manufacturing a ferroelectric memory device according to another embodiment of the present disclosure. Referring to FIG. 9, the method of manufacturing a ferroelectric memory device may include a method of forming a ferroelectric material layer 1240, on which gate electrode layer 130 is formed.

More specifically, when ferroelectric material layer 1240 is formed, a plurality of unit layers 1254a, 1254b, 1254c, 1254d, and 1254e having a concentration gradient of a dopant are formed on an interfacial insulation layer 110. In an embodiment, unit layers 1254a, 1254b, 1254c, 1254d, and 1254e may each include the same ferroelectric material and the same dopant, but unit layers 1254a, 12544b, 1254c, 1254d, and 1254e have different dopant concentrations, or distributions, within each respective unit layer. The method of forming the plurality of unit layers 1254a, 1254b, 1254c, 1254d, and 1254e may be substantially the same as the method of forming the unit layers 1252a, 1252b, 1252c, 1252d, and 1252e of second layer 1230 of an embodiment described above and with reference to FIGS. 5 to 8. Therefore, a detailed description is omitted in order to limit duplication.

Figure 10:
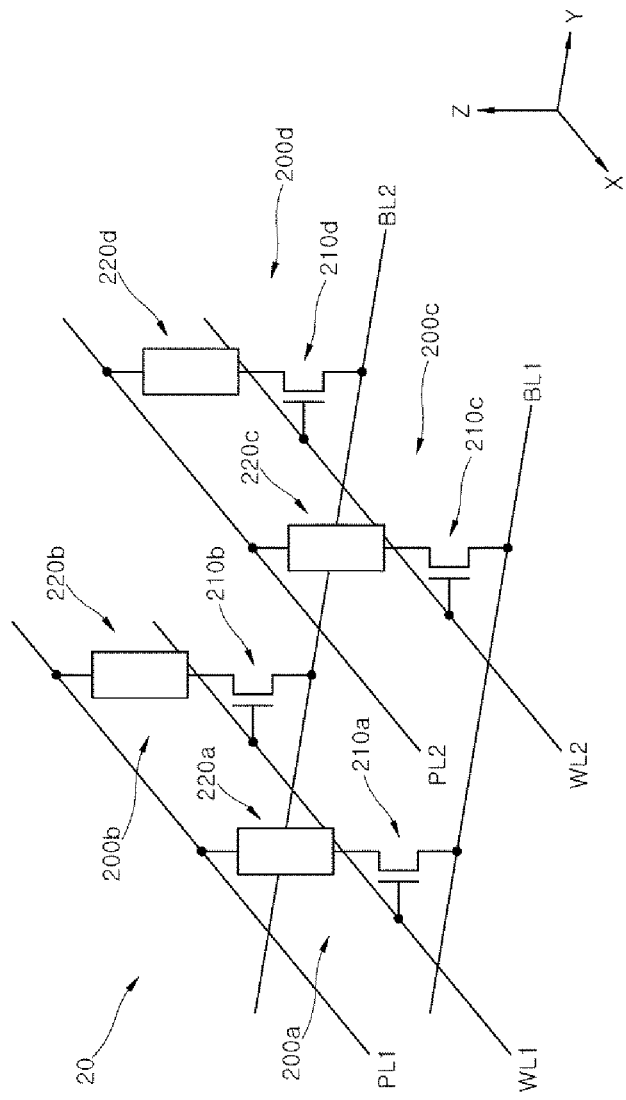
FIG. 10 is a schematic view illustrating a ferroelectric memory device according to yet another embodiment of the present disclosure.

FIG. 10 is a schematic view illustrating a ferroelectric memory device according to yet another embodiment of the present disclosure. Referring to FIG. 10, ferroelectric memory device 20 may include a plurality of bit lines BL1 and BL2, word lines WL1 and WL2, and plate lines PL1 and PL2. The plurality of world lines WL1 and WL2 and plate lines PL1 and PL2 may be arranged along the x-direction, and the plurality of bit lines BL1 and BL2 may be arranged along the y-direction that is not parallel to the x-direction.

The ferroelectric memory device 20 may include a plurality of memory cells 200a, 200b, 200c and 200d. Hereinafter, for convenience of description, the plurality of memory cells 200a, 200b, 200c and 200d will be referred to as a first memory cell 200a, a second memory cell 200b, a third memory cell 200c, and a fourth memory cell 200d.

The first memory cell 200a may include a first switching transistor 210a and a first ferroelectric memory element 220a. The second memory cell 200b may include a second switching transistor 210b and a second ferroelectric memory element 220b. The third memory cell 200c may include a third switching transistor 210c and a third ferroelectric memory element 220c. The fourth memory cell 200d may include a fourth switching transistor 210d and a fourth ferroelectric memory element 220d.

The first memory cell 200a may be disposed between first bit line BL1 and first plate line PL1 that cross each other. A gate electrode of the first switching transistor 210a of the first memory cell 200a may be connected to a first word line WL1. Likewise, the second memory cell 200b may be disposed between a second bit line BL2 and a first plate line PL1 that cross each other. A gate electrode of the second switching transistor 210b of the second memory cell 200b may be connected to the first word line WL1. The third memory cell 200c may be disposed between a first bit line BL1 and a second plate line PL2 that cross each other. A gate electrode of the third switching transistor 210c of the third memory cell 200c may be connected to a second word line WL2. The fourth memory cell 200d may be disposed between the second bit line BL2 and a second plate line PL2 that cross each other. A gate electrode of the fourth switching transistor 210d of the fourth memory cell 200d may be connected to the second word line WL2.

Like this, the ferroelectric memory device 20 may include an array of the plurality of memory cells 200a, 200b, 200c, and 200d. Although four memory cells are illustrated herein, when a larger number of bit lines BL1 and BL2, plate lines PL1 and PL2, and word lines WL1 and WL2 are disposed, more than four memory cells illustrated may be disposed.

When a target memory cell, for example, the first memory cell 200a is determined to be written among the memory cells 200a, 200b, 200c, and 200d in the ferroelectric memory device 20, the first switching transistor 210a of the first memory cell 200a may be turned on by voltages applied by the first word line WL1, the first bit line BL1, and the first plate line PL1, and the polarization state of the ferroelectric memory element 220a may be changed by the voltage applied across the ferroelectric memory element 220a. Thereafter, even after the voltage applied across the ferroelectric memory element 220a is removed, the changed polarization state can be stored in the ferroelectric memory element 220a in a nonvolatile manner.

Figure 11:
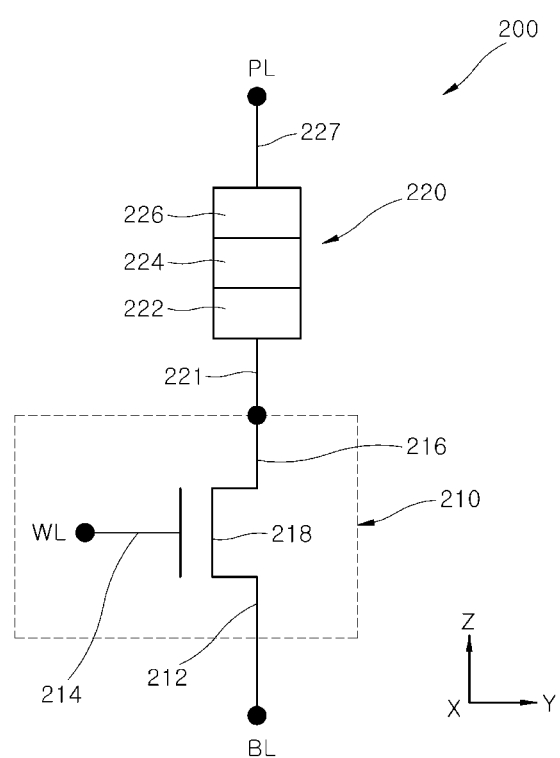
FIG. 11 is a schematic view illustrating a memory cell of a ferroelectric memory device according to an embodiment of the present disclosure.

FIG. 11 is a schematic view illustrating a memory cell of a ferroelectric memory device according to an embodiment of the present disclosure. In an embodiment, a memory cell 200 of FIG. 11 may be one of the memory cells 200a, 200b, 200c and 200d constituting the ferroelectric memory device 20 of FIG. 10. A word line WL, a bit line BL, and a plate line PL, which are connected to the memory cell 200, may be determined from the first and second word lines WL1 and WL2, the first and second bit lines BL1 and BL2, and the first and second plate lines PL1 and PL2, that are connected to the one of the memory cells 200a, 200b, 200c and 200d illustrated in FIG. 10.

Referring to FIG. 11, the memory cell 200 may include a switching transistor 210 and a ferroelectric memory element 220. The switching transistor 210 and the ferroelectric memory element 220 may be connected in series with each other through a first contact wire 221. The switching transistor 210 may be a field effect transistor having a gate dielectric layer 218. The ferroelectric memory element 220 may include a capacitive device. That is, the ferroelectric memory element 220 may include a first electrode layer 222, a ferroelectric structure 224, and a second electrode layer 226.

A gate electrode layer 214 connected to the word line WL may be disposed on the gate dielectric layer 218. A source electrode 212 and a drain electrode 216 may be disposed at opposite sides based on a gate dielectric layer 218. The source electrode 212 may be connected to the bit line BL. The drain electrode 216 may be connected to the first contact wire 221.

A predetermined voltage may be applied to the gate electrode layer 214 through the word line WL. When the applied voltage has a magnitude greater than or equal to a predetermined threshold voltage, the switching transistor 210 can be turned on. When the transistor 210 is turned on, potential of the bit line BL can be applied to the first electrode layer 222 of the ferroelectric memory element 220.

The first electrode layer 222 of the ferroelectric memory element 220 may be connected to the first contact wire 221, and the second electrode layer 226 may be connected to a second contact wire 227. The first contact wire 221 may be electrically connected to the drain electrode 216 of the switching transistor 210. The second contact wire 227 may be electrically connected to the plate line PL. In some embodiments, the second contact wire 227 may be omitted. Instead, the second electrode layer 226 of the ferroelectric memory element 220 may be directly connected to the plate line PL.

The ferroelectric memory element 220 may include a ferroelectric structure 224. The ferroelectric structure 224 can store different polarization orientations in a nonvolatile manner according to the polarity and magnitude of a write voltage applied between the first electrode layer 222 and the second electrode layer 224. In an embodiment of the present disclosure, the ferroelectric structure 224 may have substantially the same configuration as the ferroelectric structure 125 of the ferroelectric memory device 10 described above with reference to FIGS. 1 to 3.

Referring to FIG. 11, a predetermined potential may be applied to the plate line PL. For instance, a ground potential may be applied to the plate line PL. When the switching transistor 210 is turned on, a write voltage corresponding to the difference between the potential applied to the first electrode layer 222 through the bit line BL and the potential applied to the second electrode layer 226 through the plate line PL may be applied to the ferroelectric structure 224.

In an embodiment, when a ground potential is applied to the second electrode layer 226 and a first potential having a positive bias is applied to the first electrode layer 222, high dielectric constant polarization having a first polarization orientation from the first electrode layer 222 to the second electrode layer 226 may be formed in the ferroelectric structure 224. After the first potential is removed, first remanent polarization of high dielectric constant having the first polarization orientation may be stored in the ferroelectric structure 224 in a nonvolatile manner. The first remanent polarization may be recorded as first information.

In another embodiment, when a ground potential is applied to the second electrode layer 226 and a second potential having a negative bias is applied to the first electrode layer 222, high dielectric constant polarization having a second polarization orientation from the second electrode layer 226 to the first electrode layer 222 may be formed in the ferroelectric structure 224. After the second potential is removed, second remanent polarization of high dielectric constant having the second polarization orientation may be stored in the ferroelectric structure 224 in a nonvolatile manner. The second remanent polarization may be recorded as second information.

In some other embodiments, when a ground potential is applied to the second electrode layer 226 and a first potential having a positive bias is applied to the first electrode layer 222, a plurality of polarization states having different sizes in the same orientation may be formed in the ferroelectric structure 224, according to the magnitude of the first potential. The plurality of polarization states may be stored in the ferroelectric structure 224 as a plurality of remanent polarization states identified with each other. Likewise, when a ground potential is applied to the second electrode layer 226 and a second potential having a negative bias is applied to the first electrode layer 222, a plurality of polarization states having different sizes in the same orientation may be formed in the ferroelectric structure 224, according to the magnitude of the second potential. The plurality of polarization states may be stored in the ferroelectric structure 224 as a plurality of remanent polarization states identified with each other.

Meanwhile, information stored in the ferroelectric memory element 220 of the memory cell 200 may be read by the following read operation. While the switching transistor 210 is turned on, predetermined potentials may be applied to the bit line BL and the plate line PL, respectively. Accordingly, a predetermined read voltage may be applied between the first and second electrode layers 222 and 226. The read voltage may be a low voltage that does not change the polarization orientation inside the ferroelectric structure 224. When the read voltage is applied, the remanent polarization states stored inside the ferroelectric structure 224 can be identified with each other according to polarization orientation or remanent polarization size. Accordingly, signal information stored in the memory cell 220 in a nonvolatile manner can be read.

Figure 12:
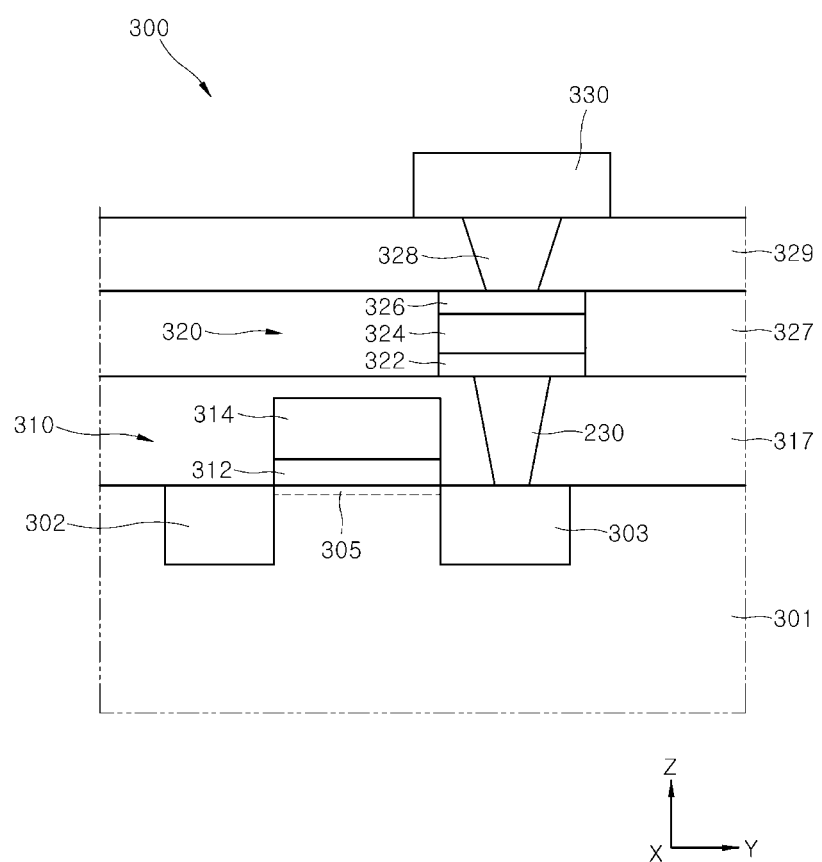
FIG. 12 is a cross-sectional view schematically illustrating a memory cell of a ferroelectric memory device according to an embodiment of the present disclosure.

FIG. 12 is a cross-sectional view schematically illustrating a memory cell of a ferroelectric memory device according to an embodiment of the present disclosure. A memory cell 300 may include a switching transistor 310 and a ferroelectric memory element 320. The memory cell 300 may be applied to the memory cells 200a, 200b, 200c and 200d described above with reference to FIGS. 1 and 2.

Referring to FIG. 12, the switching transistor 310 may be a field effect transistor disposed on a substrate 301. The switching transistor 310 may include a gate dielectric layer 312 and a gate electrode layer 314 that are sequentially disposed on the substrate 301. A source electrode 302 and a drain electrode 303 may be disposed in the substrate 301 at both ends of the gate electrode layer 314.

The substrate 301 may include a semiconductor material. The substrate 301 may, for example, include a silicon (Si) substrate, a gallium arsenide (GaAs) substrate, an indium phosphide (InP) substrate, a germanium (Ge) substrate, or a silicon germanium (SiGe) substrate. The substrate 301 may be doped into n-type or p-type to have conductivity.

The gate dielectric layer 312 may include an insulative dielectric material. The gate dielectric layer 312 may include silicon oxide, silicon nitride, silicon oxynitride, aluminum oxide, hafnium oxide, zirconium oxide, etc., for example. The gate dielectric layer 312 may have a paraelectric property. The gate dielectric layer 312 may have an amorphous property or a crystalline property.

The gate electrode 314 may be disposed on the gate dielectric layer 312. The gate electrode 314 may include a conductive material. The gate electrode 314 may include tungsten (W), titanium (Ti), copper (Cu), aluminum (Al), tungsten nitride, titanium nitride, tantalum nitride, tungsten carbide, titanium carbide, tungsten silicide, titanium silicide, tantalum silicide, or a combination of two or more thereof, as non-limiting examples.

The source electrode 302 and the drain electrode 303 may be disposed in substrate 301 regions positioned opposite to each other based on the gate electrode layer 314. The source electrode 302 and the drain electrode 303 may be regions formed by doping the substrate 301 with dopants. In an embodiment, the source electrode 302 and the drain electrode 303 may be doped with a dopant of an opposite type to the substrate 301 when the substrate 301 is doped into n-type or p-type. The source electrode 302 may be connected to a bit line (not shown). The source electrode 302 may be connected to the bit line of the ferroelectric memory device. When a gate voltage of a threshold voltage or higher is applied through the gate electrode layer 314, a channel layer 305 can be formed in a substrate 301 region positioned under the gate dielectric layer 312. Through the channel layer 305, a potential applied through the bit line and the source electrode 302 may be transferred to the drain electrode 303.

As described above, the field effect transistor type switching transistor 310 may be disposed on the substrate 301. The switching transistor 310 may serve to electrically activate the ferroelectric memory element 320 of a predetermined memory cell 300 selected from a plurality of memory cells of the ferroelectric memory device.

Referring to FIG. 12, a first interlayer insulation layer 317 may be disposed on the drain electrode 303. The ferroelectric memory element 320 may be disposed on the first interlayer insulation layer 317. The ferroelectric memory element 320 may include a first electrode layer 322, a ferroelectric structure 324, and a second electrode layer 326. The first electrode layer 322 may be electrically connected to the drain electrode 303 through a first contact wire 316. The first contact wire 316 may be a conductive plug penetrating the first interlayer insulation layer 317. The first contact wire 316 may, for example, include a conductive material such as tungsten, tungsten nitride, titanium, titanium nitride, copper, aluminum.

The first electrode layer 322 may, for example, include metal, conductive nitride, conductive oxide, etc. The first electrode layer 322 may include gold (Au), platinum (Pt), silver (Ag), ruthenium (Ru), iridium (Ir), tungsten (W), titanium (Ti), copper (Cu), aluminum (Al), tungsten nitride, titanium nitride, tantalum nitride, tungsten carbide, titanium carbide, tungsten silicide, titanium silicide, tantalum silicide, or a combination of two or more thereof, as non-limiting examples.

The ferroelectric structure 324 may be a stack structure of a single layer or a multilayer. The ferroelectric structure 324 may include at least one layer of ferroelectric material layer having a concentration gradient of a dopant. The ferroelectric material layer may, for example, include a hafnium oxide layer or a zirconium oxide layer. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, as non-limiting examples. In an embodiment, the concentration gradient of dopant may be formed in one direction along the thickness direction of the ferroelectric material layer. For instance, the concentration gradient of dopant may be distributed to be increased or decreased continuously along the thickness direction. The ferroelectric structure 324 may have substantially the same configuration as the ferroelectric structure 125 described above with reference to FIG. 1.

The second electrode layer 326 may be disposed on the ferroelectric structure 324. The second electrode layer 326 may include metal, conductive nitride, conductive oxide, etc., for example. The second electrode layer 326 may include gold (Au), platinum (Pt), silver (Ag), ruthenium (Ru), iridium (Ir), tungsten (W), titanium (Ti), copper (Cu), aluminum (Al), tungsten nitride, titanium nitride, tantalum nitride, tungsten carbide, titanium carbide, tungsten silicide, titanium silicide, tantalum silicide, or a combination of two or more thereof, as non-limiting examples. In an embodiment, the second electrode layer 326 may include the same material as the first electrode layer 322. Alternatively, the second electrode layer 326 may include a different material from the first electrode layer 322.

The ferroelectric memory element 320 may be separated from the surrounding environment by a second interlayer insulation layer 327. A third interlayer insulation layer 329 may be disposed on the ferroelectric memory element 320. A plate line 330 may be disposed on the third interlayer insulation layer 329. The plate line 330 may be electrically connected to the second electrode layer 326 of the ferroelectric memory element 320 by a second contact wire 328. The second contact wire 328 may be a conductive plug penetrating the third interlayer insulation layer 329. The second contact line 328 may include a conductive material such as tungsten (W), tungsten nitride, titanium (Ti), titanium nitride, copper (Cu), aluminum (Al), etc., for example.

As described above, the ferroelectric memory element 320 including the first electrode layer 322, the ferroelectric structure 324 and the second electrode layer 326 sequentially disposed over the substrate 301 may be disposed. The ferroelectric memory element 320 may constitute the memory cell 300 with the switching transistor 310.

Figure 13:
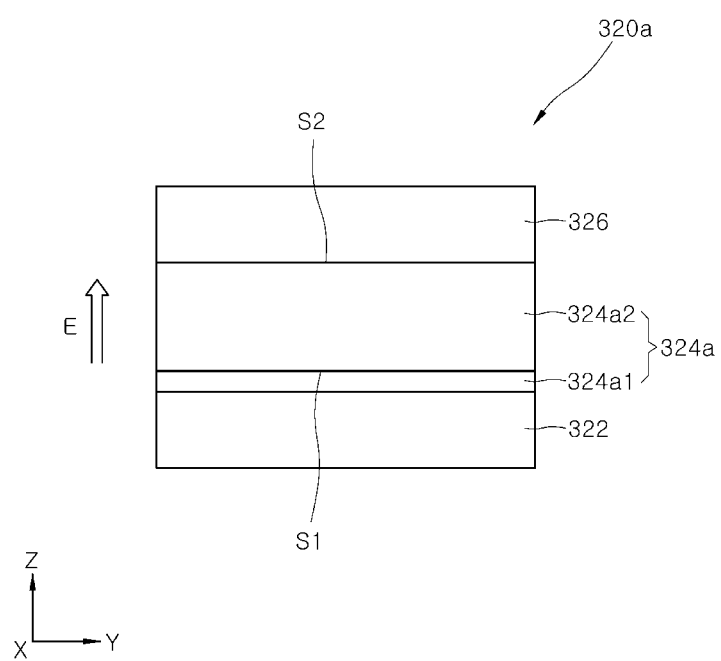
FIG. 13 is a cross-sectional view schematically illustrating a ferroelectric memory element according to an embodiment of the present disclosure.

FIG. 13 is a cross-sectional view schematically illustrating a ferroelectric memory element according to an embodiment of the present disclosure. Referring to FIG. 13, the ferroelectric memory element 320a may include a first electrode layer 322, a ferroelectric structure 324a and a second electrode layer 326.

The ferroelectric memory element 324a may include a first layer 324a1 and a second layer 324a2 that have ferroelectric properties. In an embodiment, the first layer 324a1 may be an undoped ferroelectric material layer, and the second layer 324a2 may be a ferroelectric material layer having a concentration gradient of a dopant. The concentration gradient of a dopant may be formed in a thickness direction of the second layer 324a2, that is the z-direction. For instance, the concentration of a dopant may be distributed to be increased or decreased continuously along the thickness direction of the second layer 324a2. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, as non-limiting examples.

Meanwhile, the configuration of the first layer 324a1 and the second layer 324a2 of the ferroelectric structure 324a may be substantially the same as the configuration of the first layer 121 and the second layer 122 of the ferroelectric structure 123 described above with reference to FIG. 2. Accordingly, detailed description is omitted to avoid duplication.

In this embodiment, in an interface of the first layer 324a1 and the second layer 324a2, lattice strains due to lattice mismatch may be generated. In addition, the dopant concentration gradient in the second layer 324a2 may generate a lattice strain gradient in the second layer 324a2. The lattice strain and lattice strain gradient at the interface may generate a flexoelectric effect and form an internal electric field E in the second layer 324a2. Although it is illustrated that the internal electric field E is formed from an interface S1 between the first layer 324a1 and the second layer 324a2 toward an interface S2 between the second layer 324a2 and the second electrode layer 326 in FIG. 13, it is not necessarily limited thereto. The direction of the internal electric field E may be reversed according to the concentration gradient direction of a dopant.

The internal electric field E can improve the polarization orientation inside the second layer 324a2. As the polarization orientation is improved along the internal electric field E, the ferroelectric property of the second layer 324a2 can be stabilized. As an example, the internal electric field E can suppress the ferroelectric property of the second layer 324a2 from being converted to a paraelectric property or an antiferroelectric property. As another example, the internal electric field E can align defect dipoles randomly distributed by defects present in the second layer 324a2 in one direction. As a result, the internal electric field E can improve the ferroelectric property of the second layer 324a2.

A method of manufacturing a ferroelectric memory element 320a may proceed as follows. First, a first electrode layer 322 electrically connected to a first contact wire 316 may be formed on a first interlayer insulation layer 317. For example, the first electrode layer 322 may be formed by applying sputtering, chemical vapor deposition, evaporation, or atomic layer deposition. Then, a ferroelectric structure 324a may be formed on the first electrode layer 322. A method of forming the ferroelectric structure 324a on the first electrode layer 322 may be substantially the same as the method of forming the first layer 1251 and the second layer 1230 on the substrate 101 described above with reference to FIGS. 5 to 7. In an embodiment, the ferroelectric structure 324a may be formed in an amorphous phase.

Then, a second electrode layer 326 may be formed on the ferroelectric structure 324a. The second electrode layer 326 may be formed by sputtering, chemical vapor deposition, or atomic layer deposition, for example. Then, crystallization heat treatment with respect to the ferroelectric structure 324a may proceed. The crystallization heat treatment may be performed at a process temperature of about 400 to 600° C. When the process of forming the second electrode layer 326 is performed at a process temperature of about 400 to 600° C., the ferroelectric structure 324a may be crystallized in the process of forming the second electrode layer 326. In this case, an additional crystallization heat treatment can be omitted.

Through the above-described process, the ferroelectric memory element 320a can be formed.

Figure 14:
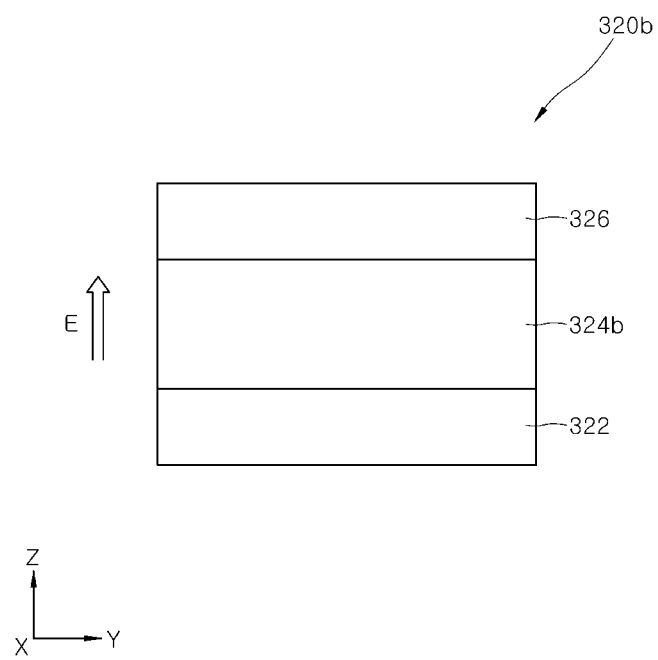
FIG. 14 is a cross-sectional view schematically illustrating a ferroelectric memory element according to another embodiment of the present disclosure.

FIG. 14 is a cross-sectional view schematically illustrating a ferroelectric memory element according to another embodiment of the present disclosure. Referring to FIG. 14, the ferroelectric memory element 320b may include a first electrode layer 322, a ferroelectric structure 324b, and a second electrode layer 326.

In this embodiment, the ferroelectric structure 324b may be a single layer of ferroelectric material layer having a concentration gradient of a dopant. The configuration of the ferroelectric material layer may be substantially the same as the configuration of the second layer 324a2 of the embodiment described above with reference to FIG. 13. Therefore, detailed description is omitted to avoid duplication.

The dopant concentration gradient in the ferroelectric structure 324b may generate a lattice strain gradient with respect to the ferroelectric structure 324b. The flexoelectric effect generated by the lattice strain gradient may form an internal electric field E in the ferroelectric structure 324b to improve polarization orientation in the ferroelectric structure 324b. As the polarization orientation is improved along the internal electric field E, the ferroelectric property of the ferroelectric structure 324b can be stabilized.

The method of forming the ferroelectric memory element 320b may be substantially the same as the method of forming the ferroelectric memory element 320a described above with reference to FIG. 13. The first electrode layer 322 may be prepared, and the ferroelectric structure 324b may be formed on the first electrode layer 322. The ferroelectric structure 324b may be formed in an amorphous phase. The method of forming the ferroelectric structure 324b may be substantially the same as the method of forming the second layer 324a2 of the ferroelectric structure 324a described above with reference to FIG. 13. Then, the second electrode layer 326 may be formed on the ferroelectric structure 324b. Next, crystallization heat treatment with respect to the ferroelectric structure 324b may be performed. When the process temperature at which the second electrode layer 326 is formed is the same as the process temperature at which the ferroelectric structure 324b is crystallized, the crystallization heat treatment can be omitted.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A ferroelectric memory element comprising:
a first electrode layer;
a ferroelectric structure disposed on the first electrode layer; and
a second electrode layer disposed on the ferroelectric structure,
wherein the ferroelectric structure comprises a first ferroelectric material layer doped with a first dopant disposed on the first electrode layer, and a second ferroelectric material layer doped with a second dopant disposed on the first ferroelectric material layer, wherein the first dopant and the second dopant are different from each other, wherein the first ferroelectric material layer and the second ferroelectric material layer are formed of different materials, and wherein at least one of the first and second ferroelectric material layers has a concentration gradient of at least one of the corresponding first and second dopants.

2. The ferroelectric memory element of claim 1,
wherein the concentration gradient of the at least one of the first and second dopants is formed in a thickness direction of the ferroelectric material layer.

3. The ferroelectric memory element of claim 1,
wherein thicknesses of the first and second ferroelectric material layers are substantially the same as grain sizes of the first and second ferroelectric material layers, respectively.

4. The ferroelectric memory element of claim 1,
wherein each of the first and second ferroelectric material layers has a thickness of 5 nm to 10 nm.

5. The ferroelectric memory element of claim 1,
wherein each of the first and second ferroelectric material layers comprises a hafnium oxide layer or a zirconium oxide layer.

6. The ferroelectric memory element of claim 5,
wherein each of the first and second dopants comprises at least one selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

7. A ferroelectric memory device comprising:
a substrate; and
a switching transistor and a ferroelectric memory element that are disposed on the substrate,
wherein the ferroelectric memory element comprises:
a first electrode layer;
a ferroelectric structure disposed on the first electrode layer; and
a second electrode layer disposed on the ferroelectric structure, wherein the ferroelectric structure comprises a first ferroelectric material layer doped with a first dopant disposed on the first electrode layer, and a second ferroelectric material layer doped with a second dopant disposed on the first ferroelectric material layer, wherein the first dopant and the second dopant are different from each other, wherein the first ferroelectric material layer and the second ferroelectric material layer are formed of different materials, wherein at least one of the first and second ferroelectric material layers has a concentration gradient of at least one of the first and second dopants, and wherein a drain electrode of the switching transistor is electrically connected to the first electrode layer of the ferroelectric memory element.

8. The ferroelectric memory device of claim 7,
wherein the concentration gradient of the at least one of the first and second dopants is formed in a thickness direction of the at least one of the first and second ferroelectric material layers.

9. The ferroelectric memory device of claim 7,
wherein thicknesses of the first and second ferroelectric material layers are substantially the same as grain sizes of the first and second ferroelectric material layers, respectively.

10. The ferroelectric memory device of claim 7,
wherein each of the first and second ferroelectric material layers has a thickness of 5 nm to 10 nm.

11. The ferroelectric memory device of claim 7,
wherein each of the first and second ferroelectric material layers comprises a hafnium oxide layer or a zirconium oxide layer.

12. The ferroelectric memory device of claim 7, further comprising:
a bit line electrically connected to a source electrode of the switching transistor;
a word line electrically connected to a gate electrode layer of the switching transistor; and
a plate line electrically connected to the second electrode layer of the ferroelectric memory element.

* * * * *